Aug. 28, 1951 L. FLEMING 2,565,490
VARIABLE FREQUENCY OSCILLATOR
Filed Nov. 29, 1945
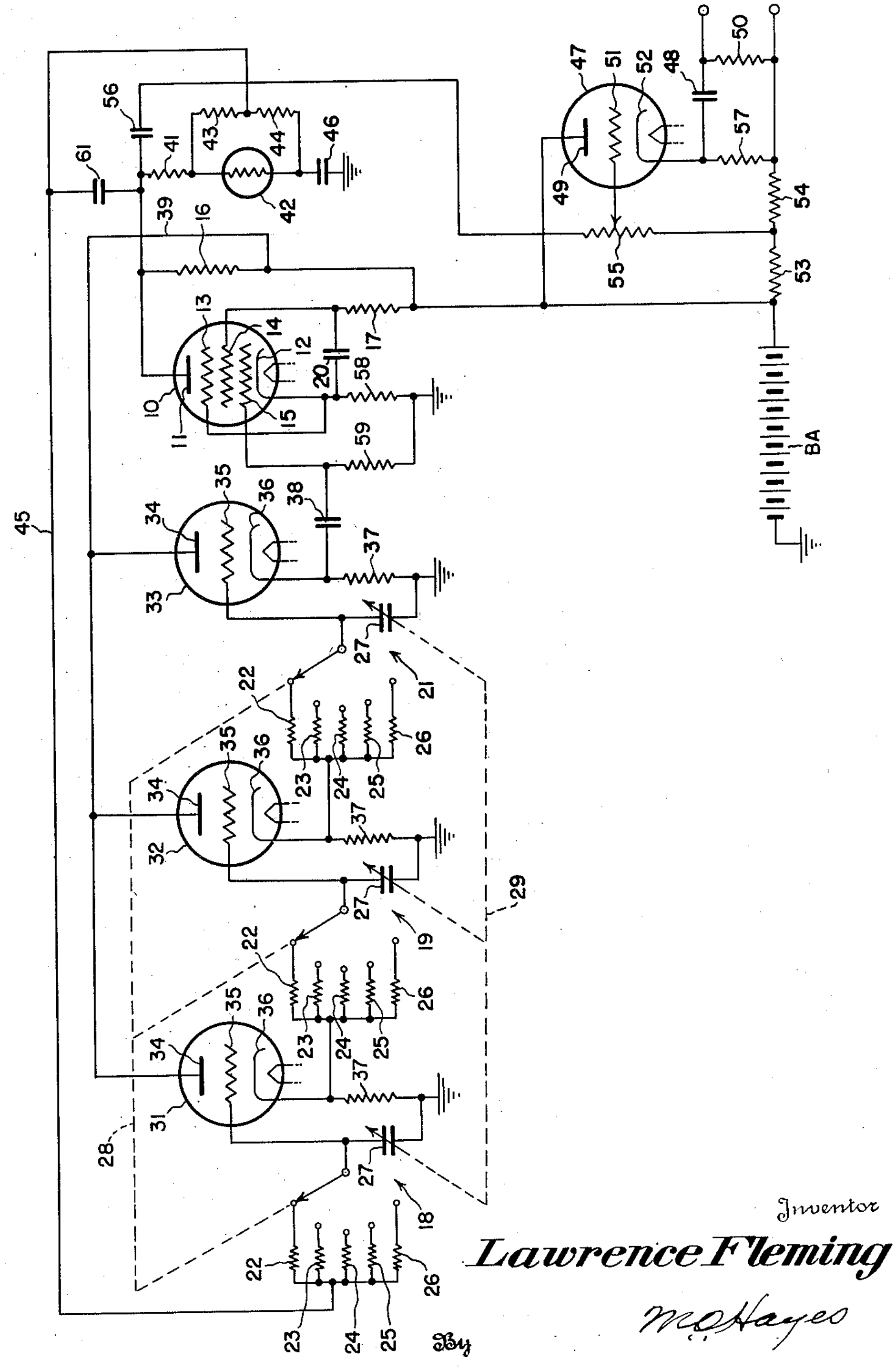
Inventor
Lawrence Fleming
By M.C. Hayes
Attorney Patented Aug. 28, 1951 2,565,490

UNITED STATES PATENT OFFICE 2,565,490

VARIABLE FREQUENCY OSCILLATOR

Lawrence Fleming, Falls Church, Va.

Application November 29, 1945, Serial No. 631,767

11 Claims. (Cl. 250—36)

(Granted under the act of March 3, 1883, as amended April 30, 1928; 370 O. G. 757)

This invention relates generally to devices for setting up and maintaining electrical oscillations of a frequency determined by certain physical constants included in the devices. More specifically, the invention relates to a phase-shift oscillator adapted to produce a stable sinusoidal voltage over a wide range of frequencies such, for example, as a few cycles per second to several megacycles per second.

In certain devices hitherto known or used for this purpose, it has been the usual practice to employ tank circuits comprising inductances and capacitances to store energy. Such arrangements, however, have proved unsatisfactory for low frequency operation by reason of the difficulty encountered in constructing the required large inductances to reduce sufficiently the energy losses sustained at low frequencies.

In certain other of the prior art devices low frequency oscillations are obtained by means of heterodyning two high frequency oscillators. Such beat frequency oscillators have not proven entirely satisfactory, however, since a small change in the frequency of one oscillator produces a large percentage change in the frequency of the other. Moreover, in order to prevent synchronization of the two oscillators at low frequencies each of the oscillators must be well shielded thereby adding to the weight and cost of each unit. In the use of such beat frequency oscillators, it has been found that the calibration thereof is not constant and must be checked and adjusted frequently.

In accordance with the preferred embodiment of the present invention, a phase-shift oscillator is provided which comprises a five element thermionic tube adapted to be operated as a class A amplifier. A fraction of the output of the amplifier tube is fed back to the input thereof through a three section, phase shifting network to establish a positive feedback circuit whereby self-sustaining oscillations may be produced of a frequency controlled by the value of certain physical constants included in the phase-shifting network. A plurality of cathode followers are arranged intermediate the sections of the aforesaid phase shifting network in order to prevent the feedback voltage from being loaded down by each of the sections of the phase-shifting network and by the amplifier tube which has a relatively low input impedance.

A stabilizing network is further provided to limit the amplitude of oscillations produced by the amplifier tube and to maintain signal distortion at a minimum. An additional cathode follower is employed to couple the high impedance, high signal level oscillating circuit to a low impedance load, thereby to prevent any changes in load from reacting on the oscillating circuit.

It is an object of the present invention to provide a new and improved resistance-capacitance tuned oscillator adapted to generate a stable sinusoidal voltage at a frequency variable from a few cycles per second to several megacycles per second.

Another object is the provision of a phase-shift oscillator of the aforedescribed character in which the amplifier tube is prevented from loading down the phase-shifting network and causing a loss in gain of the oscillator.

Another object is the provision of a phase-shift oscillator in which the amplitude of oscillation is automatically controlled and signal distortion reduced to a minimum.

Still another object is the provision of a resistance-capacitance tuned oscillator in which the effects of stray capacitance in the output circuit thereof are nullified.

Still another object is the provision of a variable frequency oscillator in which the signal output thereof may be coupled to an external load without distorting the signal when sudden changes in load occur.

A further object is the provision of a variable frequency oscillator which is small and compact, efficient and stable in operation and economical to manufacture.

Additional objects and advantages of the invention not specifically set forth hereinabove are those inherent in and pertaining to the novel arrangement of the parts thereof as will appear more clearly as the description proceeds, reference being had to the accompanying drawing which illustrates in diagrammatic form the complete electrical system of the device of the present invention according to the preferred embodiment thereof.

Referring now to the drawing, the numeral 10 designates a five element vacuum tube comprising an anode or plate 11, a cathode 12, suppressor grid 13, screen grid 14 and control grid 15. Potential is applied from one side of a battery BA to the plate 11 and screen grid 14 of tube 10 through the plate load resistor 16 and resistor 17 respectively. The control grid 15 and cathode 12 are connected to ground potential at the other side of the battery through resistors 59 and 58 respectively, the suppressor grid 13 being tied to the cathode in the usual manner and a screen by-pass condenser 20 being connected between the cathode and screen grid in the usual manner.

Connected to the control grid circuit of the tube 10 is a phase-shifting network which comprises three sections indicated generally by the numerals 18, 19 and 21. Each of the foregoing sections comprises resistors 22, 23, 24, 25 and 26 adapted selectively to be connected in series with a variable condenser 27, the resistors being ganged as indicated by the numeral 28 in order that the value of series resistance in each of the sections may be varied simultaneously. Accordingly, condensers 27 are ganged as indicated by the numeral 29 in order that the capacity of each of the sections may be simultaneously variable.

Three thermionic tubes 31, 32 and 33 are employed in the phase shifting network and are adapted to be cathode loaded and operated as cathode followers, each of the tubes comprising an anode or plate 34, a control grid 35 and a cathode 36, a load resistor 37 being connected in the usual manner between the cathode and ground. Potential is applied to the plates 34 of the cathode followers from battery BA by way of a conductor 39. The output of cathode follower 33 is coupled to the control grid 15 of the amplifier 10 through a suitable coupling condenser 38. The outputs of tubes 31 and 32 respectively are coupled to the resistors of sections 19 and 21 by reason of the connections of the resistors thereof to the cathodes of the tubes. Condensers 27 are shunted respectively between ground and the control grids of tubes 31, 32 and 33.

A stabilizing network is disposed between the plate 11 of amplifier 10 and ground and comprises a resistor 41 serially connected to a suitable variable resistor 42 such, for example, as a thermistor having a temperature coefficient such that an increase in current flow therethrough will reduce the resistance thereof. Shunting the resistor 42 are resistors 43 and 44 forming a voltage divider network which selects a portion of the voltage across resistor 42 for feedback to the control grid 15 of the amplifier by way of a conductor 45 and the phase shifting network. A condenser 46 is provided between resistor 42 and ground in order to by-pass to ground high frequency A. C. signal components.

A three element thermionic power tube 47 is arranged as a cathode follower and is adapted to couple the high impedance output of amplifier 10 through a coupling condenser 48 to a low impedance load circuit which may be connected across a resistor 50. Tube 47 comprises a plate or anode 49, a control grid 51 and a cathode 52, potential being applied to the plate 49 directly from the D. C. source BA. A fixed grid bias is provided for tube 47 by means of a voltage divider network comprising fixed resistors 53 and 54, and a variable resistor 55 which connects the voltage divider network to the grid and selects variable portions of the oscillator output for application to tube 47, the output of amplifier 10 being coupled to the control grid 51 of tube 47 through a condenser 56. Cathode load resistor 57 is connected between the cathode 52 of tube 47 and the low potential side of resistor 50, resistor 54 also being connected to resistor 57 to complete the grid circuit of tube 47.

It will be understood, of course, that the magnitude of phase shift in each of the sections 18, 19 and 21 of the phase shifting network is the same, and it is accordingly possible determine the constants of the network which will produce a definite phase shift for a given freqency. The frequency of the oscillator may be calculated from the formula $$f=\frac{\sqrt{6}}{2\pi RC}$$

wherein $f$ represents the frequency of oscillations in cycles per second; C the capacity of the condenser in each section of the phase shifting network, and R the resistance of the resistor connected in series therewith. Form the foregoing formula, it will be apparent that for stable operation at low frequencies the feedback circuit must look into an impedance high compared to that of R in the formula. It is well known that the grid circuit of an amplifier does not have an impedance of sufficiently high value to satisfy the foregoing condition, but the grid circuit of a cathode follower does.

Moreover, for stable operation of the oscillator at high frequencies, it is manifest that the value of R in the aforesaid formula is small and the source feeding the network must have an impedance low compared to that of R. The cathode followers satisfy this condition also. Moreover, the use of cathode followers 31 and 32 prevents the phase shifting network from loading down the feedback voltage and, in addition, permits the use of large values of R in each of the sections of the network whereby the frequency range of the oscillator is increased.

When voltage is applied from battery BA to the plate 11 of tube 10, current is caused to flow through the tube and the cathode resistor 58 and through the plate load resistor 16 thereby causing the plate potential of the tube to decrease. As current flows through the cathode resistor 58, the potential drop produced thereacross causes the potential of control grid 15 to to become negative with respect to the cathode 12 thereof and thus tends to decrease the amount of current flowing through the amplifier and increase the plate potential. When potential is applied from battery BA to the plate 11 of tube 10, current also flows through resistor 41 and thermistor 42 variably in accordance with changes in the plate potential. As the current flowing through thermistor 42 decreases, the resistance thereof is increased. The resistors 43 and 44 are shunted across thermistor 42 and select a predetermined amount of the voltage across the thermistor for feedback through conductor 45 to the phase-shifting network.

Each section of the phase-shifting network is adjusted to shift the phase of the feedback voltage substantially sixty degrees such that the voltage signal which appears across resistor 58 is one hundred and eighty degrees out of phase with the bias voltage appearing at the control grid of tube 10. The resultant of these two voltages causes oscillation of the plate voltage of tube 10 by driving the grid potential in a positive direction with respect to that of the cathode, thereby to increase the current flow through the amplifier and to decrease the plate potential. Oscillation is maintained at a predetermined amplitude by the action of the thermistor voltage which increases as the plate potential of the amplifier decreases, thereby to drive the control grid thereof to a lesser extent in a positive direction and tends to decrease the current flow therethrough to increase the plate potential. As the plate potential of the amplifier increases, the control grid thereof is driven in a negative direction with respect to the cathode. By reason of the accompanying decrease in thermistor voltage however, the grid is driven negative to a lesser extent and tends to increase the current flow through the amplifier and decrease the plate potential. It will be understood, of course, that any distortion in the oscillating output of the amplifier is reduced to a minimum by the aforedescribed operation of the thermistor.

In the event that stray capacitance is present across the plate load resistor 16, an undesirable phase shift of the amplifier output voltage would be produced causing the frequency of oscillation to be changed and causing a loss in gain of the oscillating system at high frequencies. In order to prevent these undesirable effects, condenser 61 is connected between the plate of the amplifier and conductor 45, thereby forming with resistors 41, 43 and 44 an R-C network which compensates for the effect of an R-C network formed by the stray capacity and the plate resistance of tube 10.

In a phase shift oscillator, as is well known by those skilled in the art, oscillation is seriously inhibited by stray resistance (leakage) across the capacitors and stray capacity across the resistors of the phase shifting network. The effect is very marked and requires the exercise of care to prevent these stray capacities and leakage resistances from interfering with the proper operation of the oscillator. Referring to the drawing, it is noted that the high input impedances of the cathode follower tubes respectively interpose high resistances in the leakage paths across the capacitors of the phase shifting network sections. It is also noted that the cathode follower tubes with their high input impedances respectively decrease the effective stray capacitances across the resistors of the sections.

As is well known in the art, the stability of an amplifier or oscillator tube may be increased by reducing the resistance in the grid circuit thereof. Reducing the grid resistance in prior art devices, however, causes heavy loading of the preceding section of the network. The interposition of a cathode follower in the subject device between the last section of the phase shifting network and the oscillator tube provides an arrangement in which the resistance in the grid circuit of the oscillator tube is maintained at a value sufficiently low to provide stable operation of the tube while applying a high output impedance comprising a light load to the last section of the network whereby loss of voltage in the network is reduced to a minimum.

From the foregoing, it should now be apparent that a variable frequency oscillator has been provided which is well adapted to fulfill the aforesaid objects of the invention.

While the invention has been described in particularity with reference to an example thereof which gives satisfactory results, it readily will be apparent to those skilled in the art to which the invention appertains, after understanding the invention, that further embodiments, modifications and changes may be made therein without departing from the spirit and scope thereof as defined by the claims appended hereto.

The present invention may be manufactured and used by or for the Government of the United States of America for governmental purposes without payment of any royalties thereon or therefor.

What is claimed as new and desired to be secured by Letters Patent of the United States is:

1. In an oscillator of the character disclosed, an amplifier having output and input circuits, means for applying a feedback voltage from said output circuit to said input circuit in such a manner as to cause the output voltage of said amplifier to oscillate, means included in said feedback voltage means and responsive to excursion in said output voltage for controlling the amplitude of oscillation thereof, and means including an R-C network interposed between said output circuit and said amplitude controlling means for compensating for the effect of stray capacitance in said output circuit whereby oscillation is maintained at a desired frequency.

2. In an oscillator of the character disclosed, an amplifier having output and input circuits, circuit means for providing a feedback voltage from said output circuit, means for applying said feedback voltage to said input circuit in proper phase relation with the output voltage of said amplifier to cause the output voltage to oscillate, means including a thermistor element responsive to excursions in said output voltage for controlling the amplitude of oscillation thereof, and capacitive reactive means interposed between said output circuit and said amplitude controlling means and adapted to prevent deviations from said proper phase relation resulting from stray capacitance present in the output circuit.

3. A device adapted to produce electrical oscillations comprising, in combination, an amplifier having output and input circuits, means responsive to variations in the output voltage of said amplifier for supplying a feedback voltage which varies in accordance therewith, a plurality of phase shifting and frequency controlling networks adapted to apply said feedback voltage to said input circuit and to cause the output voltage of said amplifier to oscillate at a predetermined frequency, a plurality of cathode followers respectively disposed intermediate said plurality of networks and adapted to present a high impedance to said feedback voltage thereby preventing the networks and said amplifier from loading down the feedback voltage, a capacitor connected intermediate said output circuit and said plurality of networks and adapted to compensate for stray capacity in said output circuit, and means responsive to excursions in the oscillating output voltage of said amplifier for limiting the amplitude of oscillation thereof.

4. A variable frequency oscillator of the character disclosed comprising, in combination, an amplifier having output and input circuits, means responsive to variations in the output voltage of said amplifier and adapted to provide a feedback voltage which varies in value in accordance therewith, a plurality of iterative R-C networks adapted to apply said feedback voltage to said input circuit and to cause the output voltage of said amplifier to oscillate at a frequency controlled by the value of R and C in each one of the plurality of networks, means for varying simultaneously the value of R and the value of C in each one of said plurality of networks thereby to vary the frequency of oscillation of said amplifier output voltage, a plurality of cathode followers respectively disposed intermediate said plurality of networks and adapted to present a high impedance to said feedback voltage whereby a large value of R may be employed in each one of the networks and the frequency range of said oscillator increased without loading down the feedback voltage, a capacitor connected intermediate said output circuit and said plurality of networks and adapted to compensate for stray capacity in said output circuit, and means adapted to control the value of said feedback voltage in response to oscillating output voltage of said amplifier thereby to control the amplitude of oscillation thereof.

5. A device adapted to produce electrical oscillations comprising, in combination, an amplifier having output and input circuits, means responsive to variations in the output voltage of said amplifier and adapted to supply a feedback voltage which varies in accordance therewith, a plurality of phase shifting and frequency controlling networks adapted to apply said feedback voltage to said input circuit and to cause the output voltage of said amplifier to oscillate at a predetermined frequency, a plurality of cathode followers respectively disposed intermediate said plurality of networks and adapted to present a high impedance to said feedback voltage thereby preventing the networks and said amplifier from loading down the feedback voltage, means responsive to excursions in the oscillating output voltage of said amplifier for controlling the amplitude of oscillation thereof, a condenser connected intermediate said output circuit and said plurality of networks and adapted to compensate for stray capacity in said output circuit, and means for coupling said output circuit to a load circuit to prevent variations in the load circuit from affecting the operation of said oscillator.

6. In an oscillator of the character disclosed, in combination, an amplifier tube having an anode, control grid, and cathode, energizing means for said tube adapted to develop a potential difference between the anode and cathode thereof, a thermistor element, circuit means connecting said thermistor element to the anode of said amplifier tube to impress thereacross at least a portion of the anode voltage, a voltage divider connected across said thermistor element, an iterative phase shifting network having a plurality of sections, an electrical connection for applying the output voltage of said voltage divider to the first of said sections, the last of said sections being connected to the control grid of said amplifier tube, the total phase shift of all said sections being of predetermined value to supply a voltage at the control grid of said amplifier tube which provides for the generation of oscillations therein, a capacitor interconnecting the anode circuit of said tube and the input of said network for compensating the stray capacitance therein, a cathode follower tube having an output circuit, and means variable at will for applying a portion of the output of said amplifier tube to the input of said cathode follower tube.

7. In an oscillator of the character disclosed, in combination, an electron discharge tube having a control grid, cathode, and anode, circuit means connected to said electron discharge tube and including three similar R-C networks and three cathode follower tubes for applying at least a portion of the voltage on said anode to said control grid in predetermined phase relationship whereby oscillations are set up in said electron discharge tube, said cathode follower tubes being arranged in said circuit means following each of said R-C networks respectively whereby the outputs of the networks are applied to the cathode follower tubes, a thermistor element, circuit means connecting said thermistor element to said anode for rendering the thermistor element effective to regulate the voltage at the anode, a utilization circuit including a fourth cathode follower tube connected to said anode, and a fourth R-C network connected to said anode for compensating for phase shifts due to the stray capacitance of said circuit means.

8. In an oscillator of the character disclosed, in combination, an electron discharge tube having a cathode, control grid, and anode, circuit means including an iterative network having a plurality of R-C sections interconnected between said anode and grid for shifting the phase of at least a portion of the voltage on said anode and applying said portion to said control grid whereby oscillations are generated in said electron discharge tube, a plurality of cathode follower tubes interposed respectively between said sections for stabilizing said phase shift and preventing loading of said sections, means including a thermistor element connected to said electron discharge tube for stabilizing the oscillating voltage generated thereby, and a utilization circuit including a cathode follower tube connected to said anode, said utilization circuit including a variable voltage divider for adjusting the voltage on the control grid of said last named cathode follower tube.

9. In an oscillator of the character disclosed, the combination of an electron discharge tube having input and output circuits for operating the tube as a class A amplifier and having an iterative R-C network interposed between said input and output circuits for causing the tube to oscillate, a plurality of cathode followers interposed respectively between the R-C sections of said interative network for stabilizing the phase shift provided thereby, an additional cathode follower, and a load circuit connected to said output circuit and including said additional cathode follower for preventing variations in the amplitude of oscillation in response to variations in the load.

10. In an oscillator of the character disclosed, the combination of an electron discharge tube having a grid, cathode, and anode, an iterative R-C network of three sections having means settable at will for rendering the parameters thereof variable together at will, a plurality of cathode followers respectively interposed between successive sections of said network, means for applying at least a portion of the voltage at the anode of said electron discharge tube to the first of said networks, a cathode follower interconnected between the last section of said network and the grid of said electron discharge tube thereby to provide a low resistance input to the tube and a high output impedance for said last section, said network being adapted to produce oscillations in said electron discharge tube at predetermined frequencies selectively in accordance with the instant settings of said settable means, a thermistor element, circuit means connecting said thermistor element to said anode for rendering the thermistor element effective to regulate the amplitude of oscillation of the voltage thereat, and a utilization circuit connected to said anode.

11. An oscillator comprising, in combination, an electron tube amplifier, an iterative phase-shifting network, an amplitude-stabilizing circuit comprising an ohmic resistance and a thermally-sensitive resistance connected in series across the output of said amplifier, a feedback connection to said amplitude-stabilizing circuit for feeding a voltage derived therefrom to the input of said phase-shifting network, and a compensating capacitance connected between the output of said amplifier and said feedback connection whereby phase shifts due to stray capacitances in the system are compensated.

LAWRENCE FLEMING.

REFERENCES CITED

The following references are of record in the file of this patent:

UNITED STATES PATENTS

| Number | Name | Date |
|---|---|---|
| 2,341,067 | Wise | Feb. 8, 1944 |
| 2,343,539 | Edson | Mar. 7, 1944 |
| 2,356,248 | Koren | Aug. 22, 1944 |
| 2,375,273 | Black | May 8, 1945 |
| 2,396,476 | Schade | Mar. 12, 1946 |
| 2,463,073 | Webb | Mar. 1, 1949 |
| 2,506,329 | Ames, Jr. | May 2, 1950 |

OTHER REFERENCES

Proceedings of the I. R. E., vol. 29, No. 2, February 1941, page 48. Phase Shift Oscillators—Ginzton & Hollingsworth.